United States Patent
Tung et al.

(10) Patent No.: US 12,002,761 B2
(45) Date of Patent: *Jun. 4, 2024

(54) SEMICONDUCTOR DEVICE, STACKED SEMICONDUCTOR DEVICE AND MANUFACTURING METHOD OF SEMICONDUCTOR DEVICE

(71) Applicant: Taiwan Semiconductor Manufacturing Company, Ltd., Hsinchu (TW)

(72) Inventors: Chih-Hang Tung, Hsinchu (TW); Chen-Hua Yu, Hsinchu (TW); Tung-Liang Shao, Hsinchu (TW); Su-Chun Yang, Hsinchu County (TW); Wen-Lin Shih, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,579

(22) Filed: Aug. 10, 2022

(65) Prior Publication Data
US 2022/0384352 A1    Dec. 1, 2022

Related U.S. Application Data

(63) Continuation of application No. 16/885,282, filed on May 28, 2020, now Pat. No. 11,456,256.

(51) Int. Cl.
*H01L 23/538* (2006.01)
*H01L 21/50* (2006.01)
(Continued)

(52) U.S. Cl.
CPC .......... *H01L 23/5384* (2013.01); *H01L 21/50* (2013.01); *H01L 21/76802* (2013.01); *H01L 21/76841* (2013.01); *H01L 21/76877* (2013.01); *H01L 23/3736* (2013.01); *H01L 23/5386* (2013.01); *H01L 25/0657* (2013.01)

(58) Field of Classification Search
CPC ................ H01L 23/5384; H01L 21/50; H01L 21/76802; H01L 21/76841; H01L 21/76877; H01L 23/3736; H01L 23/5386; H01L 25/0657
See application file for complete search history.

(56) References Cited

U.S. PATENT DOCUMENTS 6,265,307 B1 * 7/2001 Lou ................... H01L 21/76813
                                                                 438/618
8,987,922 B2    3/2015 Yu et al.
(Continued)

*Primary Examiner* — Fernando L Toledo
*Assistant Examiner* — Neil R Prasad
(74) *Attorney, Agent, or Firm* — JCIPRNET

(57) ABSTRACT

A semiconductor device includes a semiconductor substrate, a dielectric structure, an electrical insulating and thermal conductive layer and a circuit layer. The electrical insulating and thermal conductive layer is disposed over the semiconductor substrate. The dielectric structure is disposed over the electrical insulating and thermal conductive layer, wherein a thermal conductivity of the electrical insulating and thermal conductive layer is substantially greater than a thermal conductivity of the dielectric structure. The circuit layer is disposed in the dielectric structure.

20 Claims, 9 Drawing Sheets

(51) Int. Cl.
*H01L 21/768* (2006.01)
*H01L 23/373* (2006.01)
*H01L 25/065* (2023.01)

(56) References Cited

U.S. PATENT DOCUMENTS

| | | | |
|---|---|---|---|
| 9,196,532 | B2 | 11/2015 | Tu et al. |
| 9,196,559 | B2 | 11/2015 | Tsai et al. |
| 9,257,333 | B2 | 2/2016 | Lu et al. |
| 9,263,839 | B2 | 2/2016 | Chen et al. |
| 9,275,924 | B2 | 3/2016 | Wang et al. |
| 9,275,925 | B2 | 3/2016 | Chen et al. |
| 9,281,254 | B2 | 3/2016 | Yu et al. |
| 9,372,206 | B2 | 6/2016 | Wu et al. |
| 9,496,189 | B2 | 11/2016 | Yu et al. |
| 11,456,256 | B2 * | 9/2022 | Tung ............... H01L 21/76802 |
| 2012/0013013 | A1 * | 1/2012 | Sadaka ............ H01L 24/83 257/773 |
| 2021/0202347 | A1 * | 7/2021 | Liff ............... H01L 23/3677 |

* cited by examiner

SEMICONDUCTOR DEVICE, STACKED SEMICONDUCTOR DEVICE AND MANUFACTURING METHOD OF SEMICONDUCTOR DEVICE

CROSS-REFERENCE TO RELATED APPLICATION

This application is a continuation application of and claims the priority benefit of a prior application Ser. No. 16/885,282, filed on May 28, 2020. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
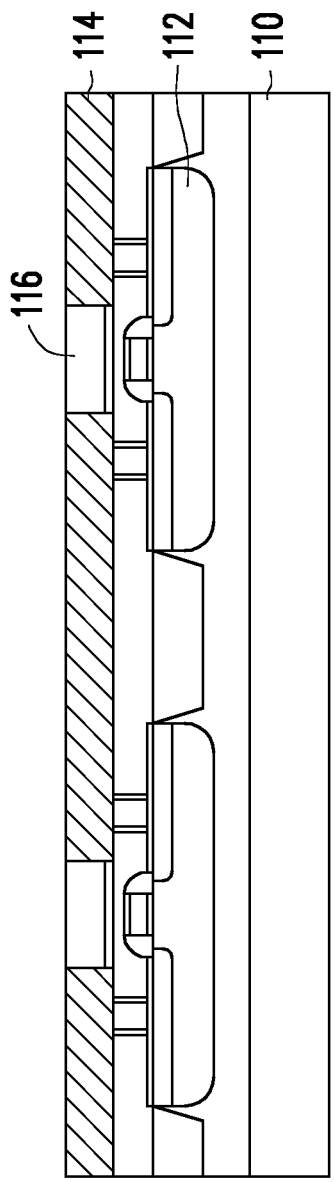
FIG. 1 to FIG. 6 illustrate cross sectional views of an intermediate stage in a manufacturing of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 6 illustrate cross sectional views of an intermediate stage in a manufacturing of a semiconductor device according to some exemplary embodiments of the present disclosure. One of the exemplary embodiments of method for manufacturing a semiconductor device 100 is provided in the following description. In some embodiments, a semiconductor substrate 110 is provided. The method of forming such semiconductor device 100 may include the following steps. With reference to FIG. 1, in accordance with some embodiments of the disclosure, a semiconductor substrate 110 is provided. In some embodiments, the semiconductor substrate 110 may be a bulk semiconductor substrate, such as a semiconductor wafer. The semiconductor substrate 110 may include silicon or another elementary semiconductor material such as germanium. For example, the semiconductor substrate 110 is a silicon wafer. In some other embodiments, the semiconductor substrate 110 includes a compound semiconductor. The compound semiconductor may include silicon germanium, gallium arsenide, silicon carbide, indium arsenide, indium phosphide, another suitable compound semiconductor, or a combination thereof. In some embodiments, the semiconductor substrate 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements 112 may be formed in and/or over the semiconductor substrate 110. Examples of the various device elements 112 may include transistors, capacitors, resistors, diodes, photo-diodes, fuses, other suitable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, P-channel and/or N channel field effect transistors (PFETs/NFETs), etc. Various processes, such as front end of line (FEOL) semiconductor fabrication processes, are performed to form the various device elements 112. The front end of line semiconductor fabrication processes may include deposition, etching, implantation, photolithography, annealing, planarization, one or more other applicable processes, or a combination thereof. The device elements 112 may be electrically connected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry or devices may be used as appropriate for a given application.

In some embodiments, isolation elements may be formed in the semiconductor substrate 110. The isolation elements are used to define active regions and electrically isolate various device elements formed in and/or over the semiconductor substrate 110 in the active regions. In some embodiments, the isolation elements may include shallow trench isolation (STI) features, local oxidation of silicon (LOCOS) features, other suitable isolation features, or a combination thereof.

In some embodiments, the semiconductor substrate 110 is provided with a metal (circuit) layer 114 and a passivation layer (not shown) covering the circuit layer 114. The metal may be copper with a thickness between, for example, about 1000 to 10000 Å and the passivation layer may include oxide, nitride or carbide with a thickness between about 30 to 50 Å. It will be noted, however, that the presently disclosed method is applicable to forming a dual damascene interconnection structure to connect to either the semiconductor substrate 110, that is, to form a contact, or to connect to an underlying metal layer (e.g. circuit layer 114), to form a via. In other words, the method can be employed for forming either damascene contacts or vias.

In some embodiments, an interconnection structure (which will be described in more detail later) is formed over the semiconductor substrate 110. The interconnection structure includes multiple dielectric layers containing an inter-layer dielectric (ILD) layers and one or more inter-metal dielectric (IMD) layers. The interconnection structure also includes multiple conductive elements formed in the ILD and IMD layers. The conductive elements may include conductive circuits (lines), conductive vias, and/or conductive contacts (pads). Various processes, such as back-end-of-line (BEOL) semiconductor fabrication processes, are performed to form the interconnection structure. In some embodiments, conductive elements may have exposed surfaces that may be treated by a planarization process, such as chemical mechanical polishing. Suitable materials for the conductive elements may include, but not limited to, for example copper, aluminum, copper alloy, or other mobile conductive materials.

Accordingly, various device elements 112 are interconnected through the interconnection structure over the semiconductor substrate 110 to form the semiconductor device 100. The semiconductor device 100 may include logic devices, memory devices (e.g., static random access memories, SRAMs), radio frequency (RF) devices, input/output (I/O) devices, system-on-chip (SoC) devices, image sensor devices, other applicable types of devices, or a combination thereof.

Figure 2:
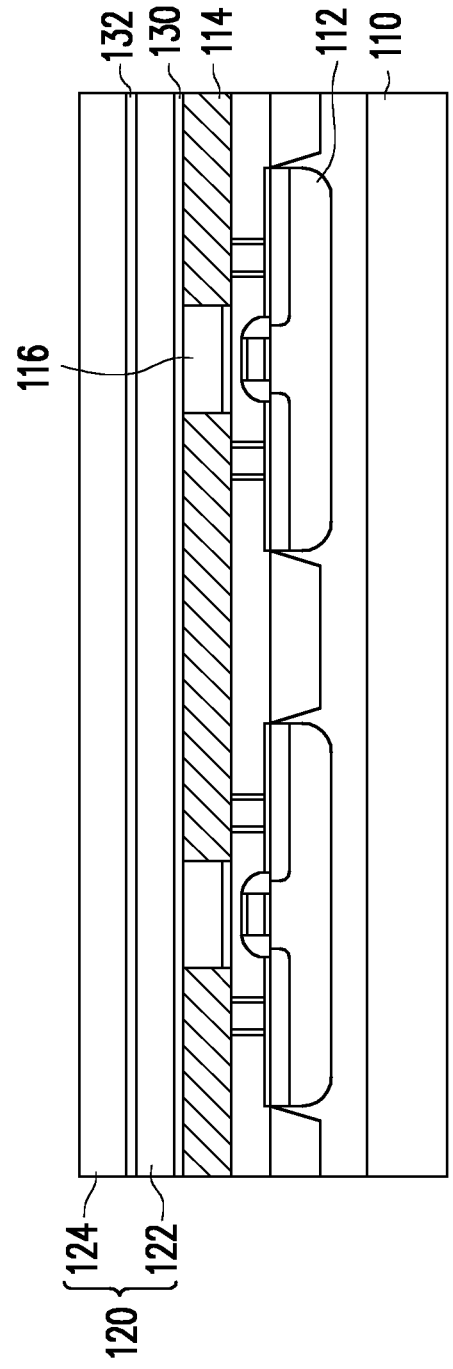

With now reference to FIG. 2, in accordance with some embodiments of the disclosure, an electrical insulating and thermal conductive layer 130 is disposed over the semiconductor substrate. In some embodiments, a circuit layer 114, for example, a conductive metal interconnect, e.g., a copper damascene, may be formed over the semiconductor substrate 110 by suitable processes known in the micro-electronic integrated circuit manufacturing process. In some embodiments, the circuit layer 114 is formed in a dielectric structure (layer) 116 and electrically connected to the device elements 112. In some embodiments, the electrical insulating and thermal conductive layer 130 may be deposited over the conductive metal interconnect 114 on the semiconductor substrate. For example, the electrical insulating and thermal conductive layer 130 may be formed by a chemical vapor deposition (CVD) method, low-pressure chemical vapor deposition (LPCVD) or plasma enhanced chemical vapor deposition (PECVD), or the like. In accordance with some embodiments of the disclosure, a material of the electrical insulating and thermal conductive layer 130 may include (hexagonal) boron nitride (h-BN), aluminum nitride (AlN), or the like. For boron nitride, it exhibits an in-plane thermal conductivity as high as about 550 W/(m·K) at room temperature, for example. For aluminum nitride, it has a high thermal conductivity of up to about 285 W/(m·K). In some embodiments, a thermal conductivity of the electrical insulating and thermal conductive layer 130 is substantially greater than a thermal conductivity of the dielectric structure (layer) 116. In some exemplary embodiments, the thermal conductivity of the electrical insulating and thermal conductive layer 130 may be substantially greater than 10 W/(m·K).

In accordance with some embodiments of the disclosure, a dielectric structure 120 is formed over the electrical insulating and thermal conductive layer 130. In some embodiments, dielectric structure 120 may be an inter-metal dielectric (IMD), which may be a single dielectric layer or a composite dielectric layer. In some embodiments, the dielectric structure 120 may be formed of silicon oxide based low-K material. In some embodiments, the dielectric structure 120 may be formed by PECVD process including organo-silane precursors such as methylsilanes, for example, tetramethylsilane and trimethylsilane. In addition, organo-siloxane precursors such as cyclo-tetra-siloxanes may be used as well to form the dielectric structure 120. The dielectric structure 120 may additionally be formed of fluorinated silicate glass (FSG). However, the disclosure is not limited thereto. The thermal conductivity of the electrical insulating and thermal conductive layer 130 may be substantially greater than the thermal conductivity of the dielectric structure 120. For example, the thermal conductivity of the dielectric structure 120 may be about 1.5 W/(m·K). In one of the implementations, the thermal conductivity of the electrical insulating and thermal conductive layer 130 may be substantially greater than about 10 W/(m·K), but the disclosure is not limited thereto.

In accordance with some embodiments of the disclosure, the dielectric structure 120 includes a lower dielectric layer 122 and an upper dielectric layer 124. The lower dielectric layer 122 is disposed over the electrical insulating and thermal conductive layer 130, and the upper dielectric layer is disposed over the lower dielectric layer 122. In some embodiments, the lower dielectric layer 122 is formed at a thickness sufficient to encompass a via opening 1261 of a subsequently formed dual damascene structure (e.g. the opening 126).

In accordance with some embodiments of the disclosure, the upper dielectric layer 124 may then be deposited, for example, formed of the same materials and the same manner as the lower dielectric layer 122. The upper dielectric layer 124 may be deposited to a thickness sufficient to encompass a trench opening 1262 of a subsequently formed dual damascene structure (e.g. the opening 126). The dielectric structure 120 may serve as an ILD or IMD layer of an interconnection structure. The dielectric structure 120 covers device elements 112 formed in and/or over the semiconductor substrate 110. Although FIG. 2 shows that the dielectric structure 120 is a multi-layer structure including dielectric sub-layers (e.g. lower dielectric layer 122 and upper dielectric layer 124). In some other embodiments, the dielectric structure 120 may be a single layer, embodiments of the disclosure are not limited thereto.

In some exemplary embodiments, an electrical insulating and thermal conductive interlayer 132 may be formed (deposited) between the lower dielectric layer 122 and the upper dielectric layer 124. In some embodiments, the electrical insulating and thermal conductive layer 130 and the electrical insulating and thermal conductive interlayer 132 may be formed of the same material, and may be functioned as etch stop layers disposed between the dielectric layers (e.g. 116, 122, 124). With such configuration, the electrical insulating and thermal conductive layer 130 and the electrical insulating and thermal conductive interlayer 132 can provide high thermal conductivity between the dielectric layers, so as to improve the heat dissipation efficiency of the semiconductor device (e.g. the semiconductor device 100 in FIG. 6).

Figure 3:
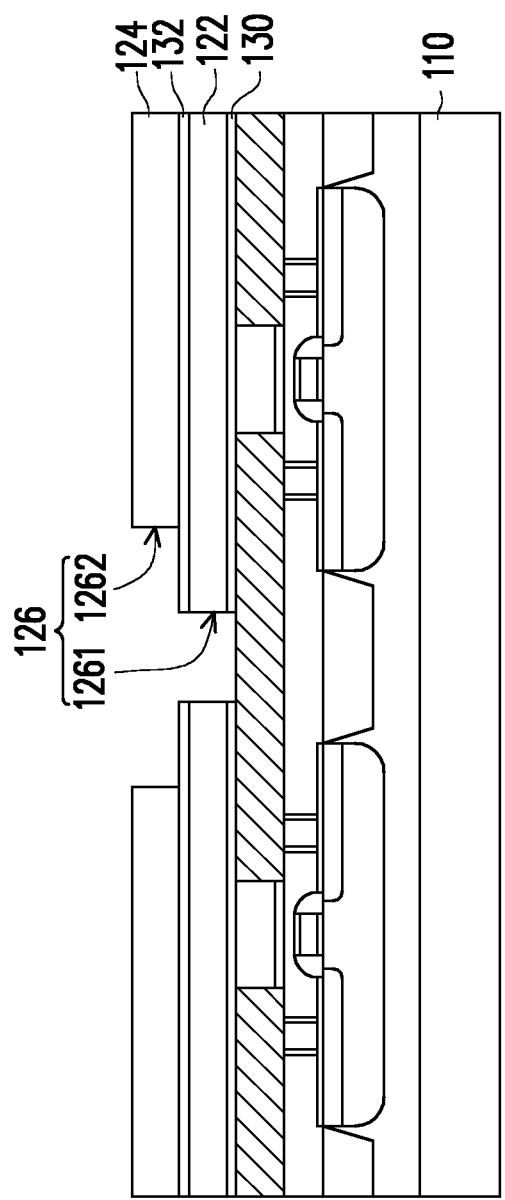

With now reference to FIG. 3, photolithographic patterning and dry etching processes may then be carried to form a(n) (damascene) opening 126 in the dielectric structure 120. In some embodiments, the opening 126 may extend through the dielectric structure 120, the electrical insulating and thermal conductive layer 130 and the electrical insulating and thermal conductive interlayer 132 for exposing, for example, the underlying circuit layer 114. In some embodiments, the opening 126 may include a via opening 1261 and a trench opening 1262. The via opening 1261 may extend through the lower dielectric layer 122, the electrical insulating and thermal conductive interlayer 132 and the electrical insulating and thermal conductive layer 130. The trench opening 1262 may extend through the upper dielectric layer 124 and communication with the via opening 1261 as shown in FIG. 3. In some embodiments, the via opening 1261 may be firstly formed by photolithographic patterning and reactive ion etch (RIE) processes. In some embodiments, the trench opening 1262 may be etched by a RIE process to stop on the electrical insulating and thermal conductive interlayer 132, which is functioned as an etch stop layer in the present embodiments. In one of the implementations, the process of forming the trench opening 1262 may include etching through an upper portion of the electrical insulating and thermal conductive interlayer 132, but not through the entire thickness of the electrical insulating and thermal conductive interlayer 132.

In detail, a first photoresist layer (not shown) may then be formed over the upper dielectric layer 124 and then patterned to form a first photoresist mask with the image of a via or a contact hole. Then, using the first photoresist layer as a mask, a via opening 1261 is then etched into the upper dielectric layer 124 and the lower dielectric layer 122, in that order, including the electrical insulating and thermal conductive interlayer 132. After the etching, the first photoresist mask is removed, for example, by oxygen plasma ashing.

After the removal of the first photoresist mask, a second photoresist layer (not shown) is formed over the upper dielectric layer 124, including the via opening 1261 formed in the previous step, and patterned with the image of a line to form a second photoresist mask with a trench opening 1262. The line pattern is next transferred from the second photoresist mask into the upper dielectric layer 124 by etching and stopping on the electrical insulating and thermal conductive layer 130, which functioned as an etch stop layer herein. This is accomplished by etching the upper dielectric layer 124 by using a recipe including, for example, $C_2F_6$, $C_4F_8$, Ar, $N_2$, $O_2$, etc. The disclosure is not limited thereto. The electrical insulating and thermal conductive layer 130 is removed from the bottom of the opening 126 and exposing the underlying first circuit layer 114, as shown in FIG. 3. Then, the second photoresist layer is removed, hence completing the forming of a damascene opening 126 having a via opening 1261 and a trench opening 1262 as shown in FIG. 3.

Figure 4:
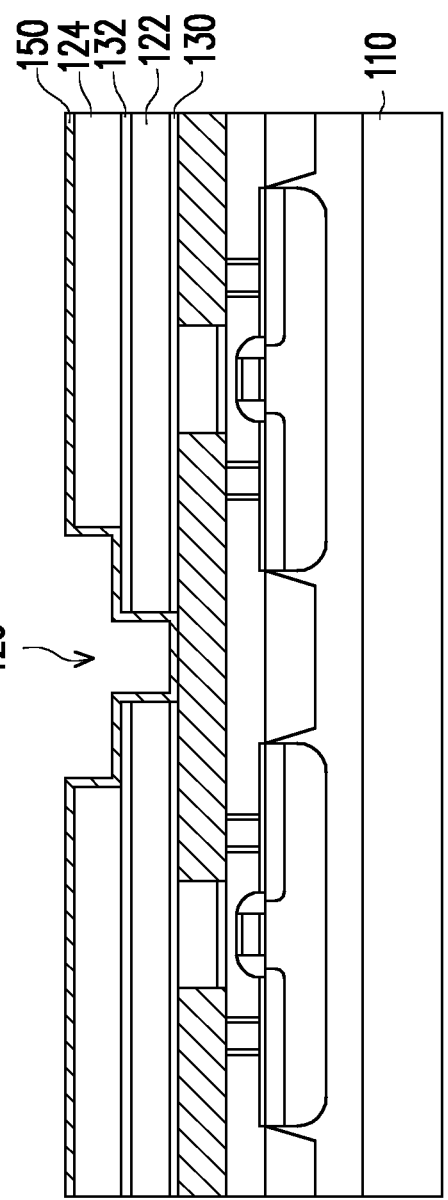
Figure 5:
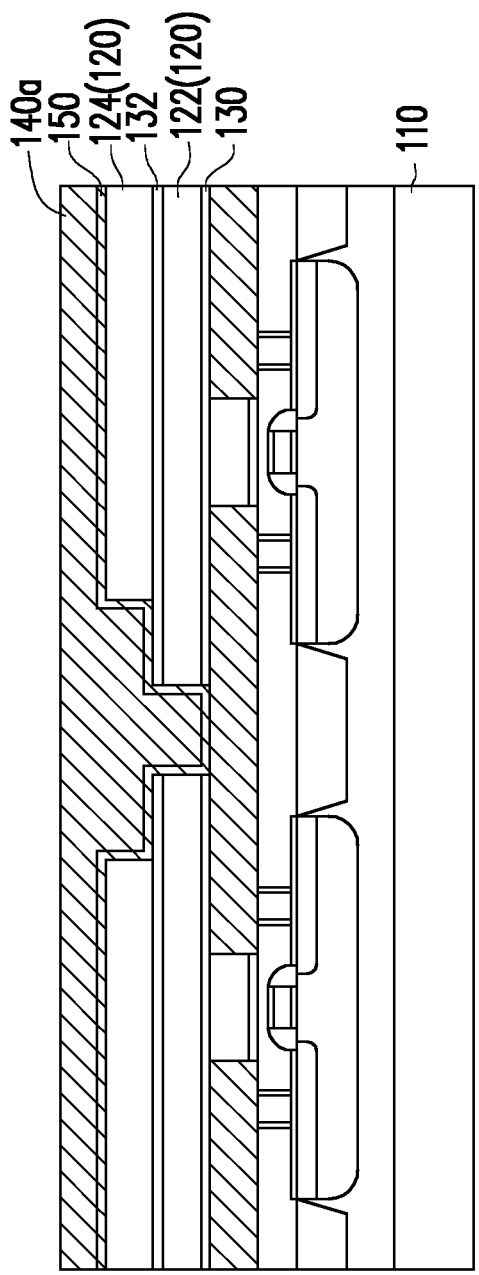

With now reference to FIG. 4, an electrical and thermal conductive layer 150 may be formed over the dielectric structure 120. In some embodiments, the electrical and thermal conductive layer 150 covers an upper surface of the upper dielectric layer 124 and an inner surface of the opening 126. In some embodiments, the electrical and thermal conductive layer 150 may be in contact with (or covers) the underlying circuit layer 114 exposed by the via opening 1261 and in contact with (or covers) a part of the electrical insulating and thermal conductive interlayer 132 exposed by the trench opening 1262. In some embodiments, the electrical and thermal conductive layer 150 may be able to be formed more reliably over a more uniform step coverage of remote plasma etched barrier layer (not shown). In some embodiments, the electrical and thermal conductive layer 150 may be functioned as a seed layer for subsequently forming a circuit layer 140 thereon.

With now reference to FIG. 4, for filling the damascene opening 126, a deposition process, for example electrochemical plating (ECP), is carried out to form a metal layer 140a on the electrical and thermal conductive layer 150 and fill the trench opening 1262 and the via opening 1261. The metal layer 140a at least contains the main metal element, e.g., copper (Cu), as contained in the electrical and thermal conductive layer 150. The metal layer 140a may further contains a second additive metal element different from the first additive metal element, such as tantalum, indium, tin, zinc, manganese, chromium, titanium, germanium, strontium, platinum, magnesium, aluminum, zirconium, or the like. In some embodiments, a material of the electrical and thermal conductive layer 150 may include graphene, or the like. For graphene, it has a high thermal conductivity of about 2000 W/(m·K) to 5000 W/(m·K). In some embodiments, a thermal conductivity of the electrical and thermal conductive layer 150 is substantially greater than a thermal conductivity of the metal layer 140a. In some exemplary embodiments, the thermal conductivity of the electrical and thermal conductive layer 150 may be substantially greater than 400 W/(m·K) for example.

Figure 6:
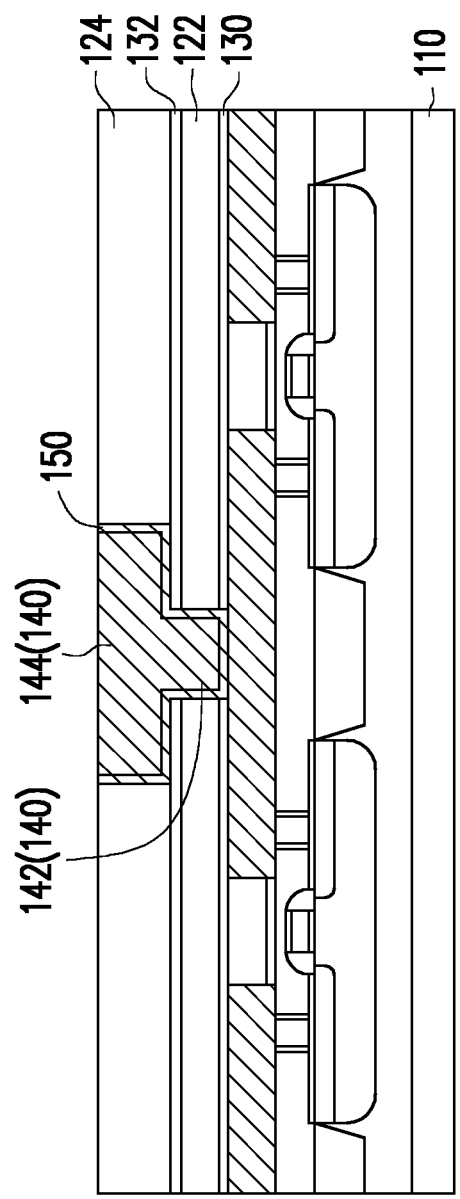

With now reference to FIG. 6, a thinning (planarization) process may then be carried out to remove the excess portion of metal layer 140a above the (damascene) opening level, optionally including barrier layer and adhesion layer, to complete the formation of the copper dual damascene and form the circuit layer 140. That is to say, the circuit layer 140 is disposed (embedded) in the dielectric structure 120 and fills the opening 126. After the planarization process, the top surface of the upper dielectric layer 124 is exposed and a planarized surface is achieved. Namely, the upper surface of the circuit layer 140 are substantially coplanar with the upper surface of the upper dielectric layer 124. In some embodiments, the thinning process includes a grinding process, which may include mechanical grinding or chemical mechanical polishing (CMP), for example. After the thinning process, a cleaning step may be optionally performed, for example, to clean and remove the residue generated from the grinding step. However, the disclosure is not limited thereto, and the thinning step may be performed through any other suitable method. In some embodiments, the thinning process may be omitted if the upper surface of the circuit layer 140 are already substantially coplanar with the upper surface of the upper dielectric layer 124.

It is noted that the process of forming the circuit layer 140 (including depositing the electrical and thermal conductive layer 150 and the circuit layer 140 and planarizing the circuit layer 140, etc.) may also be applied to any conductive layers in the semiconductor device 100 including the metal layer over the semiconductor substrate (e.g. the circuit layer 114).

With such configuration, the thermal conductivity of the electrical and thermal conductive layer 150 is substantially greater than a thermal conductivity of the metal layer 140*a*. In some exemplary embodiments, the thermal conductivity of the electrical and thermal conductive layer 150 may be substantially greater than 400 W/(m·K) for example. Accordingly, the electrical and thermal conductive layer 150 can provide higher thermal conductivity than the circuit layer 140, so as to improve the heat dissipation efficiency of the semiconductor device (e.g. the semiconductor device 100 in FIG. 6).

Figure 7:
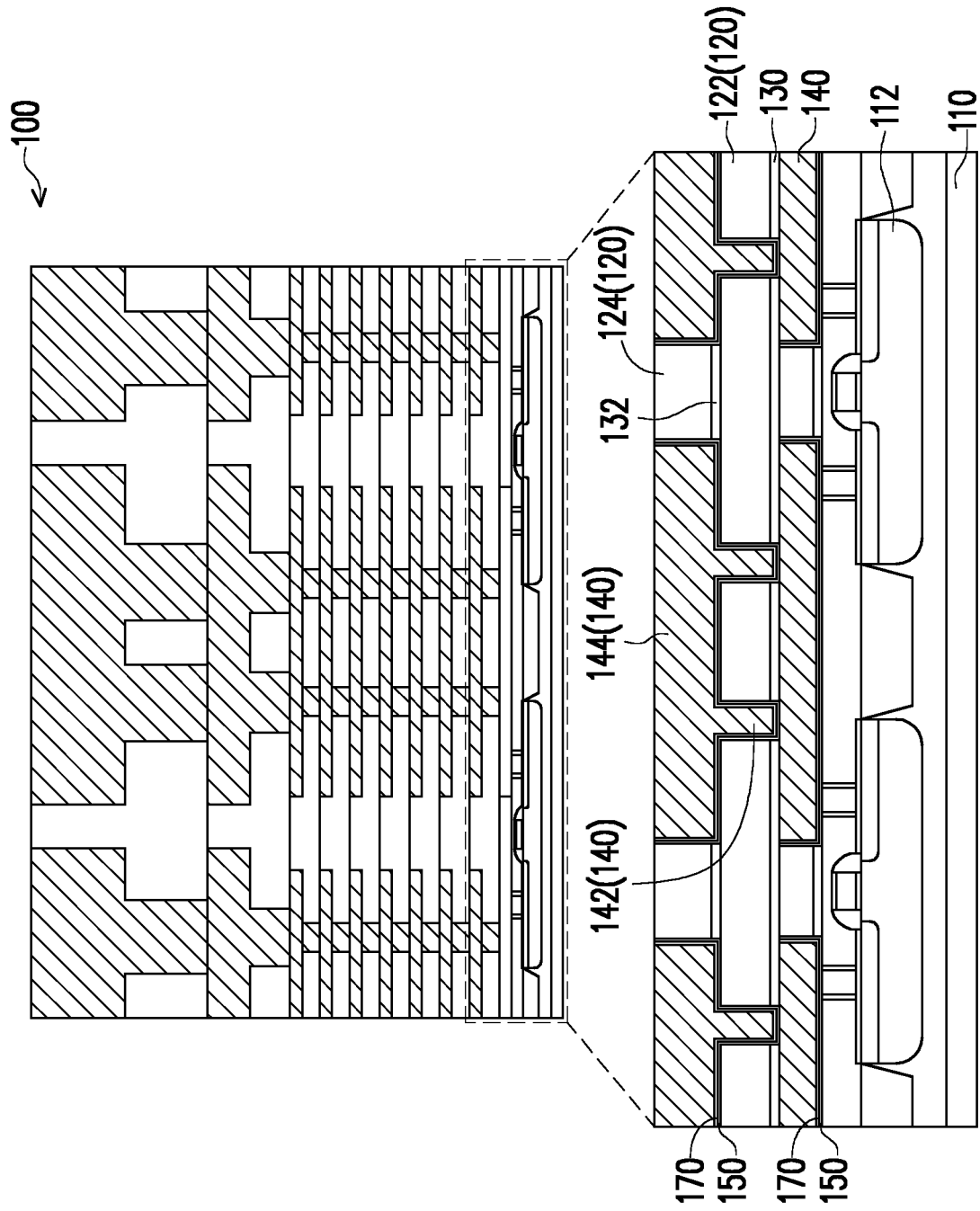
FIG. 7 illustrates a cross sectional view of a semiconductor device according to some exemplary embodiments of the present disclosure.

FIG. 7 illustrates a cross sectional view of a semiconductor device according to some exemplary embodiments of the present disclosure. With now reference to FIG. 6 and FIG. 7, after repeating the steps illustrated in FIG. 2 to FIG. 6 as required, a manufacturing process of a semiconductor device 100 may be substantially completed. For the structure aspect, in the semiconductor device 100, the electrical insulating and thermal conductive layer 130 is disposed over the semiconductor substrate 110, and the dielectric structure 120 is disposed over the electrical insulating and thermal conductive layer 130. In some embodiments, the dielectric structure 120 includes a lower dielectric layer 122 disposed over the electrical insulating and thermal conductive layer 130 and the upper dielectric layer 124 disposed over the lower dielectric layer 122. The electrical insulating and thermal conductive interlayer 132 is disposed between the lower dielectric layer 122 and the upper dielectric layer 124. In some embodiments, a part of the circuit layer 140 extends through electrical insulating and thermal conductive interlayer 132 as shown in FIG. 6. The circuit layer 140 includes a via portion 142 and a trench portion 144 communication with the via portion 142. The via portion 142 extends through the lower dielectric layer 122, the electrical insulating and thermal conductive interlayer 132 and the electrical insulating and thermal conductive layer 130 while the trench portion 144 extends through the upper dielectric layer 124. In some embodiments, the electrical and thermal conductive layer 150 covers a surface of the circuit layer 140 that is embedded in the dielectric structure 120.

In accordance with some embodiments of the disclosure, the thermal conductivity of each of the electrical insulating and thermal conductive layer 130 and the electrical insulating and thermal conductive interlayer 132 is substantially greater than the thermal conductivity of the dielectric structure 120. With such configuration, the electrical insulating and thermal conductive layer 130 and the electrical insulating and thermal conductive interlayer 132 can provide high thermal conductivity between the dielectric layers, so as to improve the heat dissipation efficiency of the semiconductor device 100. In the present embodiment, the electrical insulating and thermal conductive layer 130 and the electrical insulating and thermal conductive interlayer 132 can function as etch stop layers to both facilitate the dual damascene process and the heat dissipation efficiency. In addition, the thermal conductivity of the electrical and thermal conductive layer 150 is substantially greater than a thermal conductivity of the circuit layer 140. Accordingly, the electrical and thermal conductive layer 150 can provide higher thermal conductivity than the circuit layer 140, so as to further improve the heat dissipation efficiency of the semiconductor device 100. In the present embodiment, the electrical and thermal conductive layer 150 can function as a seed layer to both facilitate the metal deposition process and the heat dissipation efficiency.

FIG. 8 to FIG. 14 illustrate partial cross sectional views of semiconductor devices according to different exemplary embodiments of the present disclosure. It is noted that the semiconductor device 100*a* shown in FIG. 8 contains many features same as or similar to the semiconductor device 100 disclosed earlier with FIG. 1 to FIG. 7. For purpose of clarity and simplicity, detail description of same or similar features may be omitted, and the same or similar reference numbers denote the same or like components. The main differences between the semiconductor device 100*a* shown in FIG. 8 and the semiconductor device 100 disclosed earlier with FIG. 1 to FIG. 7 are described as follows.

Figure 8:
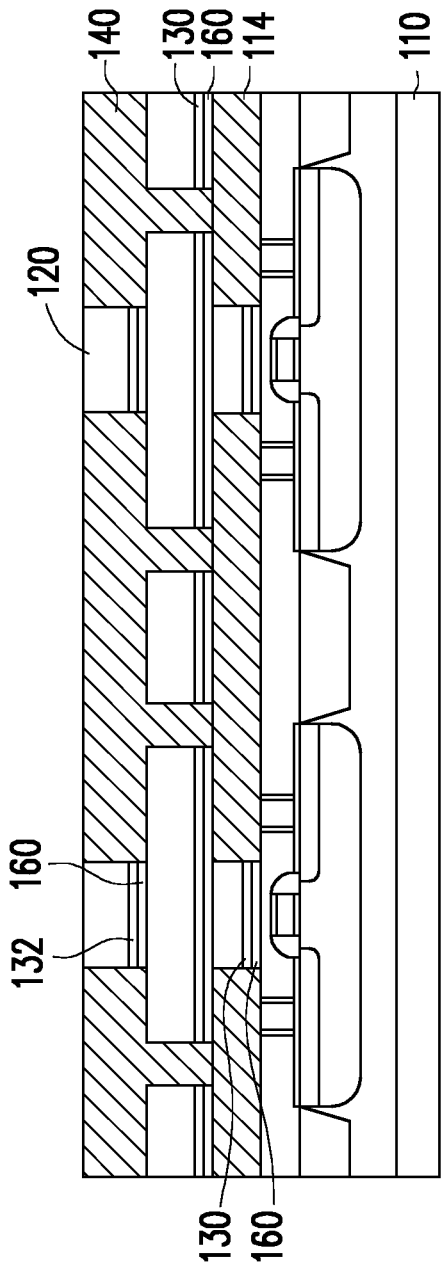
FIG. 8 to FIG. 14 illustrate partial cross sectional views of semiconductor devices according to different exemplary embodiments of the present disclosure.

With now reference to FIG. 8, in accordance with some embodiments of the disclosure, the semiconductor device 100*a* further includes at least one etch stop layer 160 (three etch stop layers 160 are illustrated but not limited thereto) disposed beneath the electrical insulating and thermal conductive layer 130 and the electrical insulating and thermal conductive interlayer 132. In other words, the etch stop layers 160 are formed over the semiconductor substrate 110 respectively prior to the deposition of the electrical insulating and thermal conductive layers 130 and the electrical insulating and thermal conductive interlayer 132. In the present embodiment, the electrical insulating and thermal conductive layer 130 and the electrical insulating and thermal conductive interlayer 132 are configured for heat dissipation between the dielectric layers (e.g. dielectric layers 116, 122, 124) while the etch stop layer 160 is configured for stopping the etching process. In some embodiments, the thermal conductivity of each of the electrical insulating and thermal conductive layer 130 and the electrical insulating and thermal conductive interlayer 132 is substantially greater than a thermal conductivity of the etch stop layer 160.

In some embodiments, the etch stop layer 160 may be formed of a composite layer including at least two different material layers. In some embodiments, the composite etch stop layer 160 is formed of a lowermost layer of silicon nitride and an overlying (uppermost) layer of silicon carbide. For example, one of the material layers, such as a lowermost layer, is formed of silicon nitride (e.g., SiN, $Si_3N_4$) or silicon oxynitride (e.g., SiON). Another layer, such as an uppermost layer, for example, an overlying layer, is formed of silicon carbide (e.g., SiC) or silicon oxycarbide (e.g., SiOC). The etch stop layer 160 may be formed by chemical vapor deposition (CVD) method, such as low-pressure chemical vapor deposition (LPCVD) or plasma enhanced chemical vapor deposition (PECVD), or the like. In some other embodiments, the etch stop layer 160 may be formed of a single layer of silicon carbide (e.g., SiC) or silicon nitride (e.g., SiN, $Si_3N_4$). However, the disclosure is not limited thereto.

In some embodiments, the etch stop layer 160 serves to add increased resistance to copper migration and advantageously enables etching endpoint detection using conventional methods, such as optical detection of etching plasma constituents, to enable controlled partial etching through a thickness of the etch stop layer 160. For example, the trench opening 1262 may be etched by a reactive ion etch (RIE) process to stop on the etch stop layer 160 (e.g., composite SiON/SiC). In detail, the RIE process may etch through, for example, the thickness of the uppermost layer, but not through the entire thickness of the etch stop layer 160.

Figure 9:
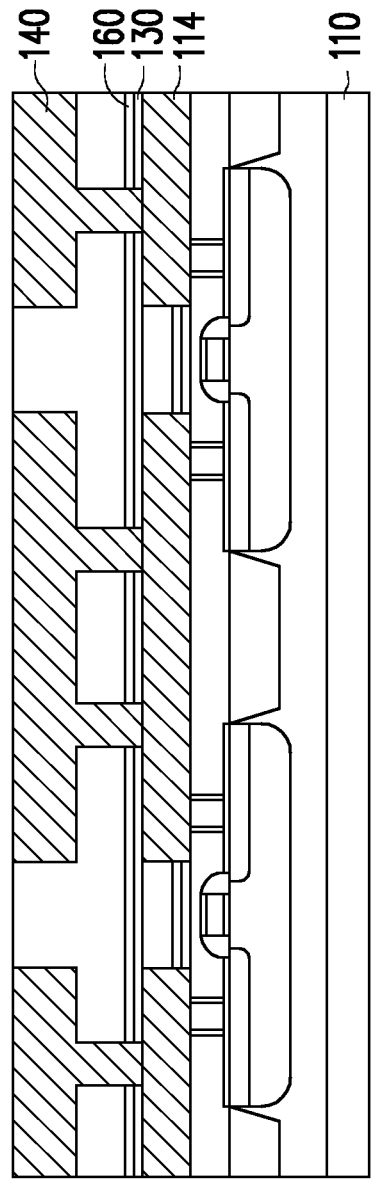

It is noted that the semiconductor device 100b shown in FIG. 9 contains many features same as or similar to the semiconductor device 100a disclosed earlier with FIG. 8. For purpose of clarity and simplicity, detail description of same or similar features may be omitted, and the same or similar reference numbers denote the same or like components. The main differences between the semiconductor device 100b shown in FIG. 9 and the semiconductor device 100a disclosed earlier with FIG. 8 are described as follows.

With now reference to FIG. 9, in accordance with some embodiments of the disclosure, the semiconductor device 100b further includes at least one etch stop layer 160 (three etch stop layers 160 are illustrated but not limited thereto) disposed over the electrical insulating and thermal conductive layer 130 and the electrical insulating and thermal conductive interlayer 132. In other words, the etch stop layers 160 are formed over the semiconductor substrate 110 respectively after the electrical insulating and thermal conductive layers 130 and the electrical insulating and thermal conductive interlayer 132 are formed. In the present embodiment, the electrical insulating and thermal conductive layer 130 and the electrical insulating and thermal conductive interlayer 132 are configured for heat dissipation between the dielectric layers (e.g. dielectric layers 116, 122, 124) while the etch stop layer 160 is configured for stopping the etching process. In some embodiments, the thermal conductivity of each of the electrical insulating and thermal conductive layer 130 and the electrical insulating and thermal conductive interlayer 132 is substantially greater than a thermal conductivity of the etch stop layer 160.

Figure 10:
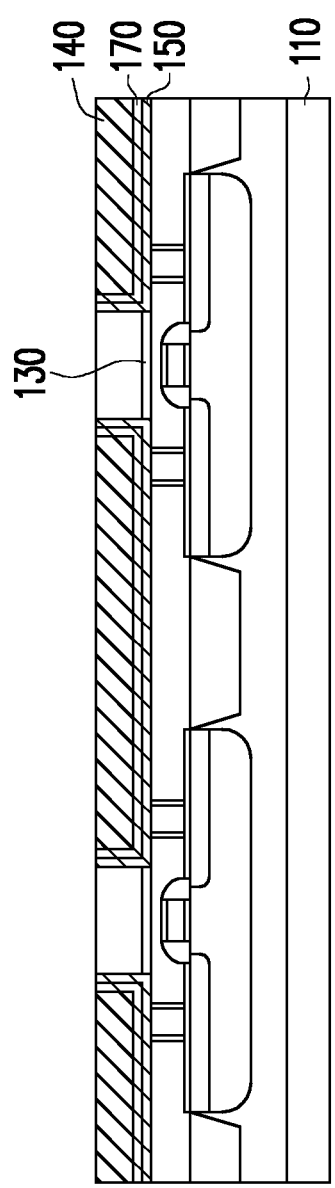

It is noted that the semiconductor device 100c shown in FIG. 10 contains many features same as or similar to the semiconductor device 100 disclosed earlier with FIG. 1 to FIG. 7. For purpose of clarity and simplicity, detail description of same or similar features may be omitted, and the same or similar reference numbers denote the same or like components. The main differences between the semiconductor device 100c shown in FIG. 10 and the semiconductor device 100 disclosed earlier with FIG. 1 to FIG. 7 are described as follows.

It is noted that the process of forming the circuit layer 140 (including depositing the electrical and thermal conductive layer 150 and the circuit layer 140 and planarizing the circuit layer 140, etc.) described above may also be applied to any conductive layers in the semiconductor device 100. For example, the configuration of the circuit layer 140 covering with the electrical and thermal conductive layer 150 may be applied to the circuit layer 140 having single damascene structures as shown in FIG. 10 to FIG. 14 and the circuit layer 140 having dual damascene structures as shown earlier in FIG. 6 to FIG. 9, both are in the contemplated scope of the present disclosure.

With now reference to FIG. 10, in accordance with some embodiments of the disclosure, the semiconductor device 100c further includes a seed layer 170 covering a surface of the circuit layer 140 that is embedded in the dielectric structure 120. In other words, the seed layer 170 is formed over the dielectric structure 120 before the circuit layer 140 is formed. In the present embodiment, the seed layer 170 is formed over the dielectric structure 120 after the electrical and thermal conductive layer 150 is formed. In some embodiments, the seed layer 170 is formed over the electrical and thermal conductive layer 150. In one embodiment, the seed layer 170 is a metal alloy layer containing at least a main metal element, e.g., copper (Cu), and a first additive metal element, e.g., manganese (Mn), Aluminum (Al). In another embodiment, the seed layer 170 is a copper-manganese (CuMn) layer. The ratio of manganese to copper contained in the CuMn layer is not limited. In other embodiments, Ti, Al, Nb, Cr, V, Y, Tc, Re, or the like can be utilized as an another additive metal for forming the seed layer 170. The seed layer 170 may be deposited by using physical vapor deposition (PVD), chemical vapor deposition (CVD), plasma enhanced CVD (PECVD), low pressure CVD (LPCVD), or other well-known deposition techniques.

In some embodiments, the thermal conductivity of the electrical and thermal conductive layer 150 is substantially greater than a thermal conductivity of the seed layer 170. Accordingly, the electrical and thermal conductive layer 150 can provide higher thermal conductivity than the circuit layer 140 and the seed layer 170 to improve the heat dissipation efficiency of the semiconductor device 100. In some embodiments, the electrical and thermal conductive layer 150 may also function as a barrier to prevent the circuit layer 140 diffusing into the dielectric structure 120. That is to say, in the present embodiment, the electrical and thermal conductive layer 150 are configured for heat dissipation between the circuit layers and preventing diffusion between the circuit layer 140 and the dielectric structure 120 while the seed layer 170 is configured for facilitating the subsequent metal deposition process.

Figure 11:
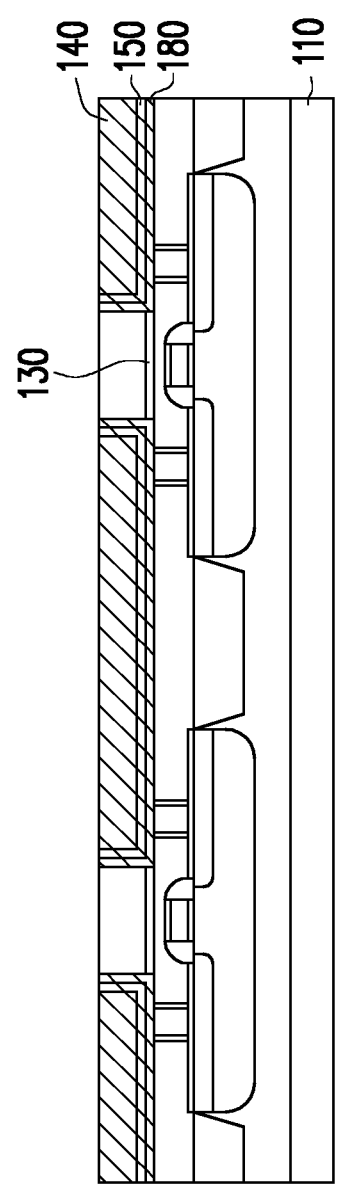

It is noted that the semiconductor device 100d shown in FIG. 11 contains many features same as or similar to the semiconductor device 100c disclosed earlier with FIG. 10. For purpose of clarity and simplicity, detail description of same or similar features may be omitted, and the same or similar reference numbers denote the same or like components. The main differences between the semiconductor device 100d shown in FIG. 11 and the semiconductor device 100c disclosed earlier with FIG. 10 are described as follows.

With now reference to FIG. 11, in accordance with some embodiments of the disclosure, the semiconductor device 100c further includes a barrier layer 180 covering a surface of the circuit layer 140 that is embedded in the dielectric structure 120. In other words, the barrier layer 180 is formed over the dielectric structure 120 before the circuit layer 140 is formed. In the present embodiment, the barrier layer 180 is formed over the dielectric structure 120 before the electrical and thermal conductive layer 150 is formed. That is to say, the barrier layer 180 is disposed beneath the electrical and thermal conductive layer 150. In some embodiments, a PVD method may be carried out to blanket deposit the barrier layer 180. In some embodiments, the barrier layer 180 may include one of a refractory metal, refractory metal nitride, and silicided refractory metal nitride layer, such as Ta, Ti, W, TaN, TiN, WN, TaSiN, TiSiN, WSiN, or the like. In one of the embodiments, the barrier layer 180 is formed of a Ta/TaN composite layer. For example, the Ta/TaN layer is deposited by an ion metal plasma (IMP) process. The barrier layer 180 is configured to prevent the circuit layer 140 diffusing into the dielectric structure 120.

In some embodiments, the thermal conductivity of the electrical and thermal conductive layer 150 is substantially greater than a thermal conductivity of the barrier layer 180. Accordingly, the electrical and thermal conductive layer 150 can provide higher thermal conductivity than the circuit layer 140 and the barrier layer 180 to improve the heat dissipation efficiency of the semiconductor device 100. In some embodiments, the electrical and thermal conductive layer 150 may also function as a seed layer to facilitating the subsequent metal deposition process. That is to say, in the present embodiment, the electrical and thermal conductive layer 150 are configured for heat dissipation between the circuit layers and facilitating the subsequent metal deposition process while the barrier layer 180 is configured for preventing the circuit layer 140 diffusing into the dielectric structure 120.

Figure 12:
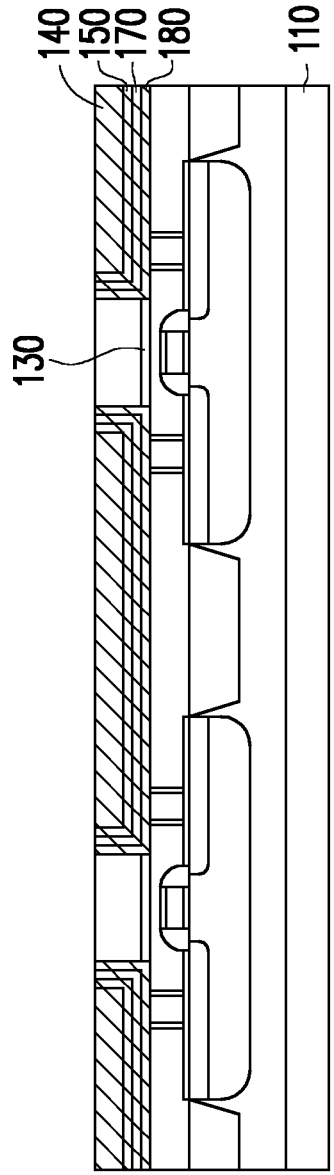
Figure 13:
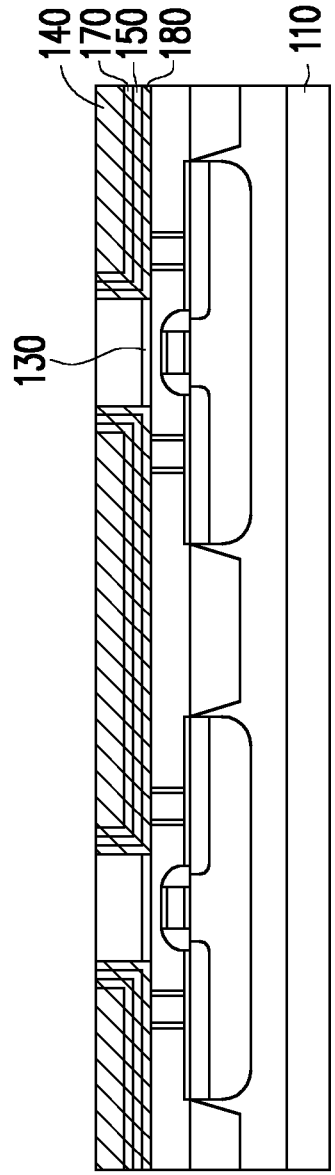
Figure 14:
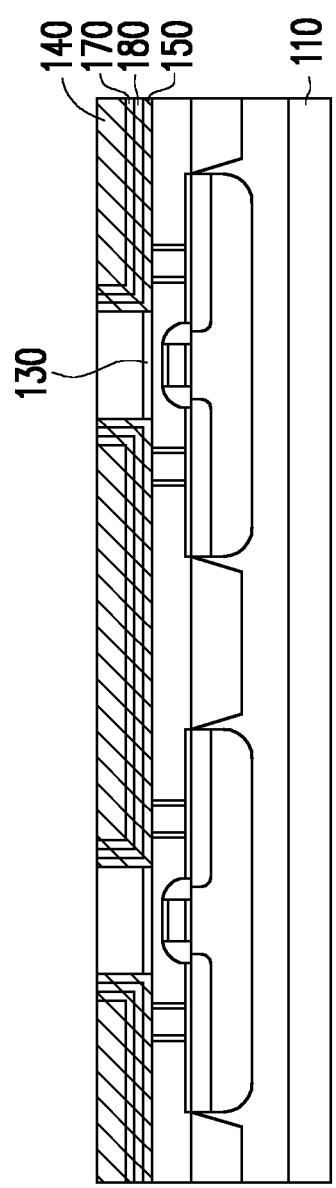

It is noted that the semiconductor devices 100e, 100f, 100g shown in FIG. 12 to FIG. 14 each contains many features same as or similar to the semiconductor device 100 disclosed earlier with FIG. 1 to FIG. 7. For purpose of clarity and simplicity, detail description of same or similar features may be omitted, and the same or similar reference numbers denote the same or like components. The main differences between each of the semiconductor devices 100e, 100f, 100g shown in FIG. 12 to FIG. 14 and the semiconductor device 100 disclosed earlier with FIG. 1 to FIG. 7 are described as follows.

With now reference to FIG. 12, in accordance with some embodiments of the disclosure, the semiconductor device 100c further includes a seed layer 170 and a barrier layer 180 a covering a surface of the circuit layer 140 that is embedded in the dielectric structure 120. In other words, the seed layer 170 and the barrier layer 180 are formed over the dielectric structure 120 before the circuit layer 140 is formed. In the present embodiment, the seed layer 170 and the barrier layer 180 are formed over the dielectric structure 120 prior to the formation of the electrical and thermal conductive layer 150. That is to say, the seed layer 170 and the barrier layer 180 are disposed beneath the electrical and thermal conductive layer 150. In one of the implementations, the barrier layer 180, the seed layer 170 and the electrical and thermal conductive layer 150 are formed over the dielectric structure 120 in order.

In one embodiment, the seed layer 170 is a metal alloy layer containing at least a main metal element, e.g., copper (Cu), and a first additive metal element, e.g., manganese (Mn), Aluminum (Al). In another embodiment, the seed layer 170 is a copper-manganese (CuMn) layer. The ratio of manganese to copper contained in the CuMn layer is not limited. In other embodiments, Ti, Al, Nb, Cr, V, Y, Tc, Re, or the like can be utilized as an another additive metal for forming the seed layer 170. The seed layer 170 may be deposited by using physical vapor deposition (PVD), chemical vapor deposition (CVD), plasma enhanced CVD (PECVD), low pressure CVD (LPCVD), or other well-known deposition techniques.

In some embodiments, a PVD method may be carried out to blanket deposit the barrier layer 180. In some embodiments, the barrier layer 180 may include one of a refractory metal, refractory metal nitride, and silicided refractory metal nitride layer, such as Ta, Ti, W, TaN, TiN, WN, TaSiN, TiSiN, WSiN, or the like. In one of the embodiments, the barrier layer 180 is formed of a Ta/TaN composite layer. For example, the Ta/TaN layer is deposited by an ion metal plasma (IMP) process. The barrier layer 180 is configured to prevent the circuit layer 140 diffusing into the dielectric structure 120.

In some embodiments, the thermal conductivity of the electrical and thermal conductive layer 150 is substantially greater than a thermal conductivity of each of the seed layer 170 and the barrier layer 180. Accordingly, the electrical and thermal conductive layer 150 can provide higher thermal conductivity than the circuit layer 140 and the barrier layer 180 to improve the heat dissipation efficiency of the semiconductor device 100. Accordingly, in the present embodiment, the electrical and thermal conductive layer 150 are configured for heat dissipation between the circuit layers, the seed layer 170 is configured for facilitating subsequent metal deposition process, and the barrier layer 180 is configured for preventing the circuit layer 140 diffusing into the dielectric structure 120.

In accordance with some embodiments of the disclosure, the configuring order of the barrier layer 180, the seed layer 170 and the electrical and thermal conductive layer 150 may vary in different embodiments. For example, with reference to FIG. 13, the barrier layer 180, the electrical and thermal conductive layer 150 and the seed layer 170 are formed over the dielectric structure 120 sequentially. With now reference to FIG. 14, the electrical and thermal conductive layer 150, the barrier layer 180, and the seed layer 170 are formed over the dielectric structure 120 sequentially. The electrical and thermal conductive layer 150 may be configured with the seed layer, the barrier layer 180, or combination thereof for encompassing the surface of the circuit layer 140 embedded in the dielectric structure 120, and the disclosure does not limit the configuration order thereof.

Figure 15:
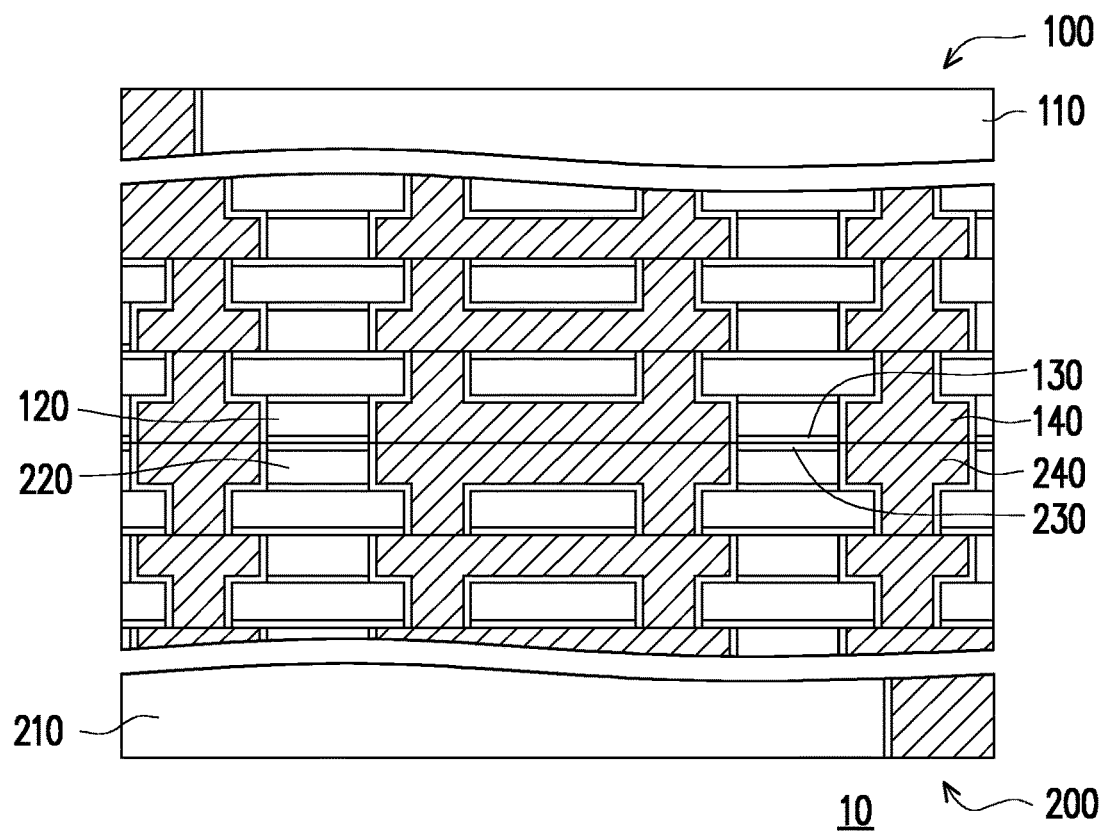
FIG. 15 illustrates a cross sectional view of a stacked semiconductor device according to some exemplary embodiments of the present disclosure.

FIG. 15 illustrates a cross sectional view of a stacked semiconductor device according to some exemplary embodiments of the present disclosure. With now reference to FIG. 15, in accordance with some embodiments of the disclosure, two semiconductor devices 100, 200 may be provided and bonded together to form a stacked semiconductor device 10. In other words, the stacked semiconductor device 10 may include a first semiconductor device 100 and a second semiconductor device 200 bonded with each other. In some embodiments, the first semiconductor device 100 and the second semiconductor device 200 may be manufactured by the same or at least similar processes described above. Accordingly, the first semiconductor device 100 and the second semiconductor device 200 may be the same or similar in structure. In some embodiments, the first semiconductor device 100 and the second semiconductor device 200 may be selected from device dies, device wafers, interposer wafers, package substrates, and the like.

In accordance with some embodiments of the disclosure, the first semiconductor devices 100 includes a first semiconductor substrate 110, a first surface dielectric layer 120, a first electrical insulating and thermal conductive layer 130, and at least one first bonding pad 140. That is to say, the second semiconductor device 200 may have a structure similar to what is described for the first semiconductor device 100, and the details of the material and formation processes are not repeated herein. The elements in the second semiconductor device 200 may be found referring to the like elements in the first semiconductor device 100. For example, with the like elements in first semiconductor device 100 starting with number "1," the elements correspond to the elements in the second semiconductor device 200 and having reference numerals starting with number "2." For example, in the illustrated FIG. 15 and FIG. 16, the second semiconductor device 200 includes a second semiconductor substrate 210, a second surface dielectric layer 220, a second electrical insulating and thermal conductive layer 230, and at least one second bonding pad 240.

In some embodiments, the surface dielectric layers 120 and 220 are disposed over the semiconductor substrates 110 and 210 respectively. In some embodiments, the surface dielectric layers 120 and 220 are the topmost dielectric layers that are furthest from the corresponding semiconductor substrates 110 and 210. The bonding pads 140 and 240 are disposed in the surface dielectric layers 120 and 220 respectively. The electrical insulating and thermal conductive layers 130 and 230 cover outer surfaces of the first surface dielectric layers 120 and 220 respectively. Accordingly, when the semiconductor devices 100 and 200 are bonded to each other, the electrical insulating and thermal conductive layers 130 and 230 are in contact with each other. Namely, the (first) electrical insulating and thermal conductive layer 130 is in contact with the (second) electrical insulating and thermal conductive layer 230.

In some embodiments, materials of the electrical insulating and thermal conductive layers 130 and 230 includes (hexagonal) boron nitride (h-BN), aluminum nitride (AlN), or the like. For boron nitride, it exhibits an in-plane thermal conductivity as high as about 550 W/(m·K) at room temperature, for example. For aluminum nitride, it has a high thermal conductivity of up to about 285 W/(m·K). However, the disclosure is not limited thereto. In some embodiments, a thermal conductivity of each of the electrical insulating and thermal conductive layers 130 and 230 is substantially greater than a thermal conductivity of each of the surface dielectric layers 120 and 220. For example, the thermal conductivity of the electrical insulating and thermal conductive layer 130 may be substantially greater than 10 W/(m·K). With such configuration, the electrical insulating and thermal conductive layers 130 and 230 can provide high thermal conductivity between the surface dielectric layers 120 and 220, so as to improve the heat dissipation efficiency of the stacked semiconductor device 10.

In accordance with some embodiments of the disclosure, the second semiconductor device 200 is disposed over and bonded to the first semiconductor device 100. In some embodiments, the first semiconductor device 100 and the second semiconductor device 200 may be pre-bonded. For example, the first semiconductor device 100 and the second semiconductor device 200 may be first aligned, with the bonding pads 140 of the first semiconductor device 100 aligned to the bonding pads 240 of the second semiconductor device 200. After the alignment, the first semiconductor device 100 and the second semiconductor device 200 are pressed against each other. During the pre-bonding process, a small pressing force may be applied to press the first semiconductor device 100 and the second semiconductor device 200 against each other. The pre-bonding may be performed at the room temperature (for example, between about 21° C. to about 25° C.), although higher temperatures may be used.

After the pre-bonding process, the surface dielectric layers 120 and 220 are bonded to each other. Then, the bonded semiconductor devices 100 and 200 may go through an annealing process to improve the bonding strength. The annealing process may be performed at a temperature between about 300° C. and about 400° C., for example. When temperature rises, the OH bond in the surface dielectric layers 120 and 220 break to form strong Si—O—Si bonds, and hence the semiconductor devices 100 and 200 are bonded to each other through fusion bonds (and through Van Der Waals force). In addition, during the annealing process, the copper in the bonding pads 140 and 240 diffuse to each other, so that metal-to-metal bonds are also formed. In other words, the second bonding pads 240 are bonded with respective ones of the first bonding pads 140 during the annealing process. Hence, the resulting bonds between semiconductor devices 100 and 200 are hybrid bonds. After the bonding, the stacked semiconductor device 10 may be sawed into packages, with the portions of semiconductor devices 100 and 200 in the packages including dies.

Figure 16:
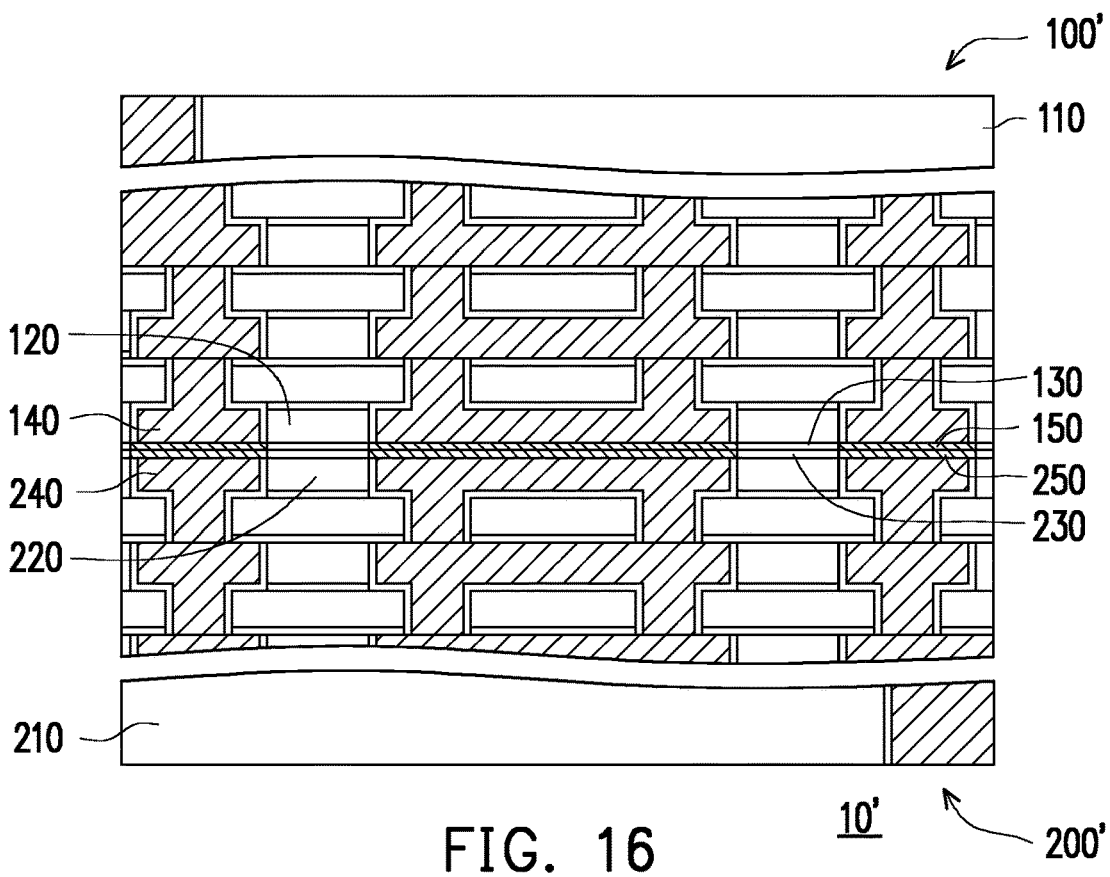
FIG. 16 illustrates a cross sectional view of a stacked semiconductor device according to some exemplary embodiments of the present disclosure.

In some other embodiments, the bonding pads 140 and 240 involved in the hybrid bonding may have single damascene structures rather than dual damascene structures, as shown in FIG. 15 and FIG. 16. In other words, the configuration of the electrical insulating and thermal conductive layers 130 and 230 may be applied to the bonding pads have single damascene structures, and the bonding pads having dual damascene structures, both are in the contemplated scope of the present disclosure. With such configuration, the electrical insulating and thermal conductive layers 130 and 230 provides high thermal conductivity between the surface dielectric layers 120 and 220, so as to improve the heat dissipation efficiency of the stacked semiconductor device 10.

FIG. 16 illustrates a cross sectional view of a stacked semiconductor device according to some exemplary embodiments of the present disclosure. It is noted that the stacked semiconductor device 10' shown in FIG. 16 contains many features same as or similar to the stacked semiconductor device 10 disclosed earlier with FIG. 15. For purpose of clarity and simplicity, detail description of same or similar features may be omitted, and the same or similar reference numbers denote the same or like components. The main differences between each of the stacked semiconductor device 10' shown in FIG. 16 and the stacked semiconductor device 10 disclosed earlier with FIG. 15 are described as follows.

With now reference to FIG. 16, in accordance with some embodiments of the disclosure, the first semiconductor device 100' may further include a first electrical and thermal conductive layer 150 covering a first bonding surface of the circuit layer 140. Correspondingly, the second semiconductor device 200' may further include a second electrical and thermal conductive layer 250 covering a second bonding surface of the circuit layer 240 that is to be bonded with the first bonding surface of the circuit layer 140. In other words, when the first semiconductor device 100' and the second semiconductor device 200' are bonded together, the first electrical and thermal conductive layer 150 and the second electrical and thermal conductive layer 250 are in contact (bonded) with each other to facilitate thermal conduction. In some embodiments, materials of the electrical and thermal conductive layers 150 and 250 may respectively include graphene, or the like. For graphene, it has a high thermal conductivity of about 2000 W/(m·K) to 5000 W/(m·K). In some embodiments, the thermal conductivity of each of the electrical and thermal conductive layers 150 and 250 is substantially greater than a thermal conductivity of the circuit layer 140. In some exemplary embodiments, the thermal conductivity of each of the electrical and thermal conductive layers 150 and 250 may be substantially greater than 400 W/(m·K) for example.

With such configuration, the electrical insulating and thermal conductive layers 130 and 230 provide high thermal conductivity between the surface dielectric layers 120 and 220, while the electrical and thermal conductive layers 150 and 250 provide higher thermal conductivity than the circuit layers 140 and 240 to facilitate the thermal conduction between the semiconductor devices 100' and 200'. Therefore, the heat dissipation efficiency of stacked semiconductor device 10' can be further improved.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor device includes a semiconductor substrate, an electrical insulating and thermal conductive layer, a dielectric structure and a circuit layer. The electrical insulating and thermal conductive layer is disposed over the semiconductor substrate. The dielectric structure is disposed over the electrical insulating and thermal conductive layer, wherein a thermal conductivity of the electrical insulating and thermal conductive layer is substantially greater than a thermal conductivity of the dielectric structure. The circuit layer is disposed in the dielectric structure.

In accordance with some embodiments of the disclosure, a stacked semiconductor device includes a first semiconductor device and a second semiconductor device disposed over and bonded to the first semiconductor device. The first semiconductor device includes a first semiconductor substrate, a first surface dielectric layer, a first electrical insulating and thermal conductive layer, and a first bonding pad. The first surface dielectric layer is disposed over the first semiconductor substrate. The first electrical insulating and thermal conductive layer covers a first outer surface of the first surface dielectric layer, wherein a thermal conductivity of the first electrical insulating and thermal conductive layer is substantially greater than a thermal conductivity of the first surface dielectric layer. The first bonding pad is disposed in the first surface dielectric layer. The second semiconductor device includes a second semiconductor substrate, a second surface dielectric layer, second electrical insulating and thermal conductive layer, and a second bonding pad. The second surface dielectric layer is disposed over the second semiconductor substrate. The second electrical insulating and thermal conductive layer covers a second outer surface of the second surface dielectric layer, wherein a thermal conductivity of the second electrical insulating and thermal conductive layer is substantially greater than a thermal conductivity of the second surface dielectric layer. The second bonding pad is disposed in the second surface dielectric layer and bonded with the first bonding pad.

In accordance with some embodiments of the disclosure, a manufacturing method of a semiconductor device includes the following steps. An electrical insulating and thermal conductive layer is formed over a semiconductor substrate. A dielectric structure is formed over the electrical insulating and thermal conductive layer, wherein a thermal conductivity of the electrical insulating and thermal conductive layer is substantially greater than a thermal conductivity of the dielectric structure. An opening is formed in the dielectric structure, wherein the opening extending through the dielectric structure and the electrical insulating and thermal conductive layer. A circuit layer is formed in the dielectric structure, wherein the circuit layer fills the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  a semiconductor substrate;
  an electrical insulating and thermal conductive layer disposed over the semiconductor substrate;
  a dielectric structure disposed over the electrical insulating and thermal conductive layer, wherein a thermal conductivity of the electrical insulating and thermal conductive layer is substantially greater than a thermal conductivity of the dielectric structure; and
  a circuit layer damascened in the dielectric structure, wherein the circuit layer comprises a bottom surface closest to the semiconductor substrate, and a lower surface of the electrical insulating and thermal conductive layer is substantially coplanar with the bottom surface of the circuit layer.

2. The semiconductor device as claimed in claim 1, wherein a material of the electrical insulating and thermal conductive layer comprises boron nitride (h-BN) or aluminum nitride (AlN).

3. The semiconductor device as claimed in claim 1, further comprising an etch stop layer disposed over the electrical insulating and thermal conductive layer, wherein the thermal conductivity of the electrical insulating and thermal conductive layer is substantially greater than a thermal conductivity of the etch stop layer.

4. The semiconductor device as claimed in claim 1, further comprising an etch stop layer disposed beneath the electrical insulating and thermal conductive layer, wherein the thermal conductivity of the electrical insulating and thermal conductive layer is substantially greater than a thermal conductivity of the etch stop layer.

5. The semiconductor device as claimed in claim 1, wherein the dielectric structure comprises a lower dielectric layer disposed over the electrical insulating and thermal conductive layer and an upper dielectric layer disposed over the lower dielectric layer.

6. The semiconductor device as claimed in claim 5, further comprising an electrical insulating and thermal conductive interlayer disposed between the lower dielectric layer and the upper dielectric layer, wherein a thermal conductivity of the electrical insulating and thermal conductive interlayer is substantially greater than a thermal conductivity of the dielectric structure.

7. The semiconductor device as claimed in claim 6, wherein a part of the circuit layer extend through electrical insulating and thermal conductive interlayer.

8. The semiconductor device as claimed in claim 5, wherein the circuit layer comprises a via portion extending through the lower dielectric layer and the electrical insulating and thermal conductive layer and a trench portion extending through the upper dielectric layer and communication with the via portion.

9. The semiconductor device as claimed in claim 1, further comprising an electrical and thermal conductive layer covering a surface of the circuit layer that is embedded in the dielectric structure, wherein a thermal conductivity of the electrical and thermal conductive layer is substantially greater than a thermal conductivity of the circuit layer.

10. The semiconductor device as claimed in claim 9, further comprising a seed layer, a barrier layer or a combination thereof covering a surface of the circuit layer that is embedded in the dielectric structure.

11. The semiconductor device as claimed in claim 9, further comprising an etch stop layer disposed between the semiconductor substrate and the dielectric structure and in contact with the electrical insulating and thermal conductive layer.

12. A stacked semiconductor device, comprising:
  a first semiconductor device comprising:
    a first semiconductor substrate;

a first surface dielectric layer disposed over the first semiconductor substrate;

a first circuit layer embedded in the first surface dielectric layer;

a first electrical and thermal conductive layer in physical contact with the first circuit layer, wherein a thermal conductivity of the first electrical and thermal conductive layer is substantially greater than a thermal conductivity of the first circuit layer; and a first electrical insulating and thermal conductive layer covering a first outer surface of the first surface dielectric layer, wherein a thermal conductivity of the first electrical insulating and thermal conductive layer is substantially greater than a thermal conductivity of the first surface dielectric layer; and a second semiconductor device disposed over and bonded to the first semiconductor device, comprising:

a second semiconductor substrate;

a second surface dielectric layer disposed over the second semiconductor substrate; and a second electrical insulating and thermal conductive layer covering a second outer surface of the second surface dielectric layer and in physical contact with the first electrical insulating and thermal conductive layer.

13. The stacked semiconductor device as claimed in claim 12, wherein a material of each of the first electrical insulating and thermal conductive layer and the second electrical insulating and thermal conductive layer comprises boron nitride (h—BN) or aluminum nitride (AlN).

14. The stacked semiconductor device as claimed in claim 12, wherein the first semiconductor device further comprises a first circuit layer embedded in the first surface dielectric layer, and the second semiconductor device further comprises a second circuit layer embedded in the second surface dielectric layer and bonded with the first circuit layer.

15. The stacked semiconductor device as claimed in claim 14, wherein the first semiconductor device further comprises a first electrical and thermal conductive layer covering the first circuit layer, and a thermal conductivity of the first electrical and thermal conductive layer is substantially greater than a thermal conductivity of the first circuit layer.

16. The stacked semiconductor device as claimed in claim 14, wherein the second semiconductor device further comprises a second electrical and thermal conductive layer covering the second circuit layer, and a thermal conductivity of the second electrical and thermal conductive layer is substantially greater than a thermal conductivity of the circuit layer.

17. A manufacturing method of a semiconductor device, comprising:

forming an electrical insulating and thermal conductive layer over a semiconductor substrate;

forming a dielectric structure over the electrical insulating and thermal conductive layer, wherein a thermal conductivity of the electrical insulating and thermal conductive layer is substantially greater than a thermal conductivity of the dielectric structure;

forming a stepped opening in the dielectric structure, wherein the opening extending through the dielectric structure and the electrical insulating and thermal conductive layer;

forming a circuit layer in the dielectric structure by a damascene process, wherein the circuit layer fills the stepped opening and comprises a bottom surface closest to the semiconductor substrate, and a lower surface of the electrical insulating and thermal conductive layer is substantially coplanar with the bottom surface of the circuit layer.

18. The manufacturing method of the semiconductor device as claimed in claim 17, wherein forming the dielectric structure further comprises:

forming a lower dielectric layer over the electrical insulating and thermal conductive layer;

forming an upper dielectric layer over lower dielectric layer, wherein the opening comprises a via opening extending through the lower dielectric layer and the electrical insulating and thermal conductive layer, and a trench opening extending through the upper dielectric layer and communication with the via opening.

19. The manufacturing method of the semiconductor device as claimed in claim 17, further comprising:

forming an etch stop layer right prior to or right after the electrical insulating and thermal conductive layer is formed.

20. The manufacturing method of the semiconductor device as claimed in claim 17, further comprising:

forming an electrical and thermal conductive layer over the dielectric structure before the circuit layer is formed, wherein a thermal conductivity of the electrical and thermal conductive layer is substantially greater than a thermal conductivity of the circuit layer.

* * * * *